US010205279B2

(12) United States Patent
Endo

(10) Patent No.: US 10,205,279 B2
(45) Date of Patent: Feb. 12, 2019

(54) INTERFACE APPARATUS, INTERFACE UNIT, PROBE APPARATUS, AND CONNECTION METHOD

(71) Applicant: TOKYO ELECTRON LIMITED, Tokyo (JP)

(72) Inventor: Tomoya Endo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/760,877

(22) PCT Filed: Aug. 5, 2016

(86) PCT No.: PCT/JP2016/073173
§ 371 (c)(1),
(2) Date: Mar. 16, 2018

(87) PCT Pub. No.: WO2017/051625
PCT Pub. Date: Mar. 30, 2017

(65) Prior Publication Data
US 2018/0277991 A1    Sep. 27, 2018

(30) Foreign Application Priority Data
Sep. 24, 2015   (JP) .................................. 2015-187290

(51) Int. Cl.
*H01R 11/30*        (2006.01)
*H01R 13/631*       (2006.01)
(Continued)

(52) U.S. Cl.
CPC ....... *H01R 13/631* (2013.01); *H01R 12/7076* (2013.01); *H01R 12/732* (2013.01);
(Continued)

(58) Field of Classification Search
CPC . H01R 13/44; H01R 13/6691; H01R 13/7037
(Continued)

(56) References Cited

U.S. PATENT DOCUMENTS 8,465,296 B1 *  6/2013  Lin ........................ H01R 13/62
                                                    439/39
8,529,274 B2 *  9/2013  Li ....................... H01R 13/6205
                                                    439/38

(Continued)

FOREIGN PATENT DOCUMENTS

| JP | 2003505836 A | 2/2003 |
| KR | 10-2011-0015272 A | 2/2011 |
| KR | 10-2014-0078834 A | 6/2014 |

OTHER PUBLICATIONS

International Search Report dated Nov. 8, 2016 corresponding to application No. PCT/JP2016/073173.

*Primary Examiner* — Phuong Chi T Nguyen
(74) *Attorney, Agent, or Firm* — Nath, Goldberg & Meyer; Jerald L. Meyer

(57) ABSTRACT

In an interface apparatus, when a load is applied to a base member and a connector part is pushed onto an external connector, a spring contracts so that an interval between the base member and a holder is reduced. An inclined surface of a coupling member is separated from an inclined surface of the holder so that fixing of the holder by the coupling member is released and the coupling member can move freely inside a hollow section. As a result, the holder and the connector part can move freely in X-Y directions relative to the base member, and a terminal of a connector can be finely adjusted in the X-Y direction, thus being precisely aligned with the external connector.

9 Claims, 5 Drawing Sheets

(51) Int. Cl.
    *H01R 25/00*     (2006.01)
    *H01R 13/502*     (2006.01)
    *H01R 12/70*     (2011.01)
    *H01R 43/26*     (2006.01)
    *H01R 12/73*     (2011.01)
    *G01R 1/073*     (2006.01)

(52) U.S. Cl.
    CPC ....... *H01R 13/5025* (2013.01); *H01R 25/006* (2013.01); *H01R 43/26* (2013.01); *G01R 1/07342* (2013.01); *H01R 2201/20* (2013.01)

(58) Field of Classification Search
    USPC .......................................... 439/39, 188, 289
    See application file for complete search history.

(56) References Cited

U.S. PATENT DOCUMENTS

| | | | |
|---|---|---|---|
| 8,696,366 B2 * | 4/2014 | Chen ...................... | H01R 11/30 439/39 |
| 8,727,326 B2 * | 5/2014 | Lin ......................... | B25B 11/02 269/8 |
| 9,004,924 B2 * | 4/2015 | Kuo ................... | H01R 13/6205 439/188 |

* cited by examiner

INTERFACE APPARATUS, INTERFACE UNIT, PROBE APPARATUS, AND CONNECTION METHOD

TECHNICAL FIELD

The present disclosure relates to an interface apparatus for electrically connecting two parts, an interface unit and probe device including the same, and a connection method.

BACKGROUND

In a process of manufacturing a semiconductor device, probe inspection for evaluating the electrical characteristics of the semiconductor device is performed. The probe inspection is performed to evaluate the electrical characteristics by bring a probe needle of a probe card into contact with an electrode of the semiconductor device formed on a semiconductor substrate, inputting an electrical signal from a tester part to each semiconductor device, and observing an electrical signal outputted corresponding to the inputted electrical signal. At the time of the probe inspection, an interface apparatus for electrically connecting the probe card and the tester part may be used.

As connection structure between an interface apparatus and a probe card, for example, a contact structure between a pogo pin and an electrode pad has been adopted. However, in order to ensure an electrical connection, a fitting structure for fitting male-structured and female-structured connectors with each other may be used. In this case, for example, it is necessary to collectively fit a plurality of connectors provided at the side of the interface apparatus to a plurality of connectors provided at the side of the probe card. This requires high alignment accuracy and high processing accuracy. Also, as the number of connectors increases, the load becomes higher for connection.

As a mechanism for collectively connecting a plurality of connectors, for example, Patent Document 1 (Japanese Patent Laid-Open Publication No. 2003-505836) discloses an interface apparatus in which a connector has clearance applied in a direction perpendicular to an axial direction of the connector. However, the mechanism of Patent Document 1 has a disadvantage in that the position of the connector becomes unstable due to the clearance, which makes it difficult to align the connectors with high accuracy.

Meanwhile, the probe card needs to be appropriately exchanged depending on the type of semiconductor wafer. As such, it is necessary to consider the existence of an instrument error when the probe card is connected to the tester part. This further makes it difficult to align when a plurality of connectors provided at the side of the interface apparatus is fitted to a plurality of connectors provided at the side of the probe card.

SUMMARY

The present disclosure provides some embodiments of an interface apparatus capable of aligning connectors with high accuracy.

According to one embodiment of the present disclosure, an interface apparatus includes: a connector configured to be connected to an external connector; and a support part configured to support the connector.

In the interface apparatus of the present disclosure, the support part includes a base member, and a holder configured to be connected to the base member, having a hollow section defined therein, and configured to hold the connector. Further, the support part includes a pushing member configured to be interposed between the base member and the holder and configured to push the holder toward the external connector, and a coupling member configured to be fixed to the base member and configured to be inserted into the hollow section of the holder with a clearance applied between the coupling member and the hollow section.

In the interface apparatus of the present disclosure, the coupling member is engaged with an inner wall of the hollow section in a state in which the holder is separated from the base member at a first interval by virtue of a pushing force of the pushing member, whereby the holder is fixed to the base member.

Further, in the interface apparatus of the present disclosure, the coupling member is separated from the inner wall of the hollow section in a state in which the base member and the holder are closer to each other at a second interval smaller than the first interval, against the pushing force, whereby the holder is freely movable relative to the base member.

In the interface apparatus of the present disclosure, the connector may be fitted to the external connector.

In the interface apparatus of the present disclosure, the inner wall may have an inclined surface that is expanded in a direction in which the pushing member pushes the holder, and the coupling member may have a conical-shaped portion having an inclined surface corresponding to the inclined surface.

In the interface apparatus of the present disclosure, an interval between the base member and the holder may be reduced from the first interval to the second interval by virtue of the pushing force by which the connector and the external connector push against each other.

In the interface apparatus of the present disclosure, the connector may include a circuit board provided with wiring connected to the external connector.

The interface apparatus of the present disclosure may further include a positioning part configured to perform a positioning operation between the connector and the external connector.

According to another embodiment of the present disclosure, there is provided an interface unit including: any one of the aforementioned interface apparatuses; and a support member configured to collectively support a plurality of interface apparatuses, wherein the plurality of interface apparatuses is collectively connected to a plurality of external connectors.

According to still another embodiment of the present disclosure, there is provided a probe device including any one of the aforementioned interface apparatuses.

According to yet another embodiment of the present disclosure, there is provided a connection method for connecting any one of the aforementioned interface apparatuses to an external connector.

The connection method of the present disclosure includes: roughly aligning the connector and the external connector in a state in which the holder is separated from the base member at the first interval by virtue of the pushing force of the pushing member; precisely aligning the connector and the external connector in a state in which the base member and the holder are closer to each other at the second interval smaller than the first interval, against the pushing force by pushing the connector and the external connector against each other; and fitting the connector to the external connector by further pushing the connector and the external connector against each other.

DETAILED DESCRIPTION

Hereinafter, embodiments of the present disclosure will be described with reference to the accompanying drawings.

[Probe Device]

Figure 1:
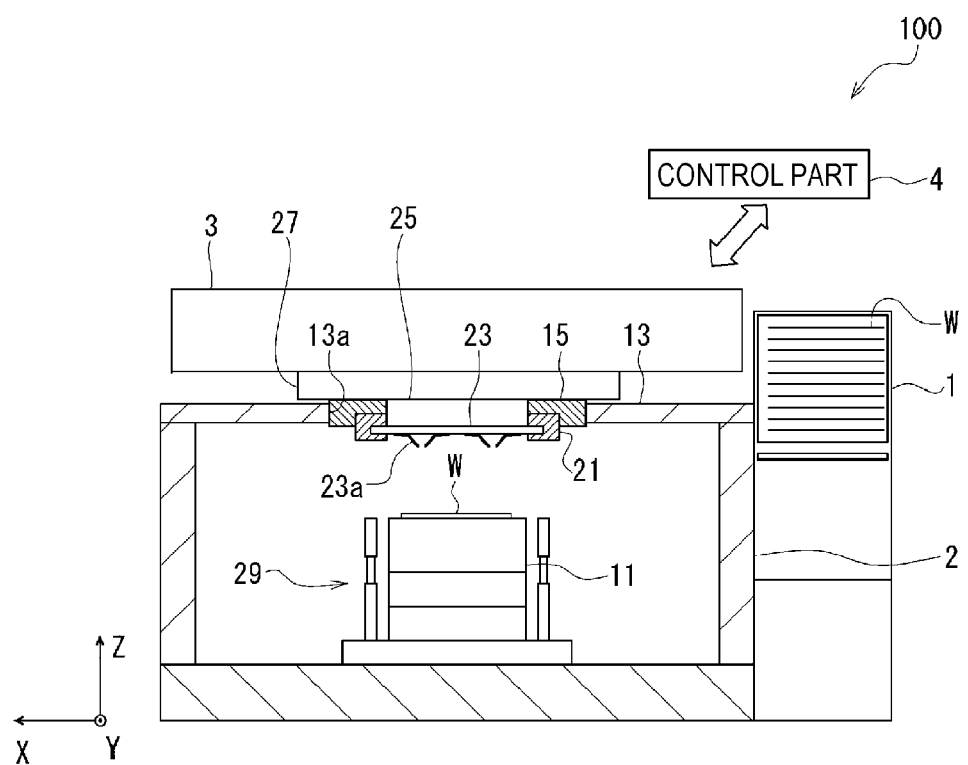
FIG. 1 is a cross-sectional view showing the schematic configuration of a probe device according to an embodiment of the present disclosure.

FIG. 1 is a cross-sectional view showing the schematic configuration of a probe device 100 according to an embodiment of the present disclosure. The probe device 100 of the present embodiment inspects the electrical characteristics of a device (not shown) such as a semiconductor device formed on a semiconductor wafer (hereinafter sometimes simply referred to as a "wafer") W.

The probe device 100 includes a loader chamber 1 that defines a transfer region in which a wafer W is transferred, an inspection chamber 2 that accommodates the wafer W, a test head 3 disposed so as to cover the inspection chamber 2 from above and configured to transmit an electrical signal to each device formed on the wafer W and receives a response signal from each device, and a control part 4 that controls respective components of the probe device 100.

The inspection chamber 2 includes a stage 11 that is movable in a horizontal direction (X direction, Y direction, and θ direction) and a vertical direction (Z direction) with the wafer W placed on the stage 11, and an insertion ring 15 that is provided above the stage 11 and fixed to an opening 13a formed substantially in the center of a head plate 13. A probe card 23 is detachably held to the insertion ring 15 by a probe card holder 21. The probe card 23 has a plurality of probes (contactors) 23a.

The probe card 23 is electrically connected to the test head 3 via an interface part 25 and an interposer (or performance board) 27 while being held to the insertion ring 15. The interface part 25 and the interposer (or performance board) 27 may be components or detachable replacement parts of the probe device 100. In FIG. 1, the interface part 25 and the interposer (or the performance board) 27 show only their positions, and details thereof are omitted. Further, the interposer (or performance board) 27 may be omitted.

Although not shown, the inspection chamber 2 includes an alignment mechanism for aligning the plurality of probes 23a with electrode pads of a plurality of devices formed on the wafer W.

In addition, an internal transfer mechanism 29 for receiving the probe card 23 attached to the probe card holder 21 via an external transfer device and attaching the probe card 23 to the insertion ring 15 is arranged with the stage 11.

[Interface Apparatus]

Figure 2:
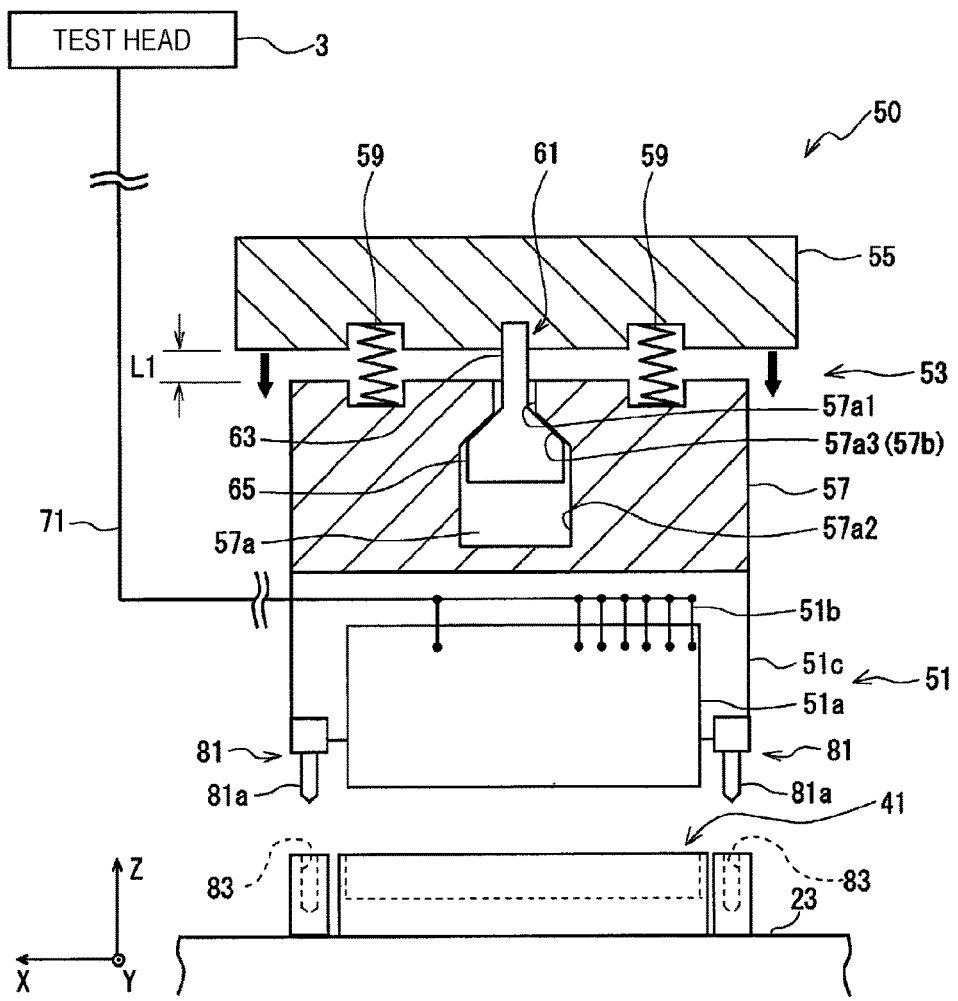
FIG. 2 is an explanatory view showing the schematic configuration of an interface apparatus.
Figure 3:
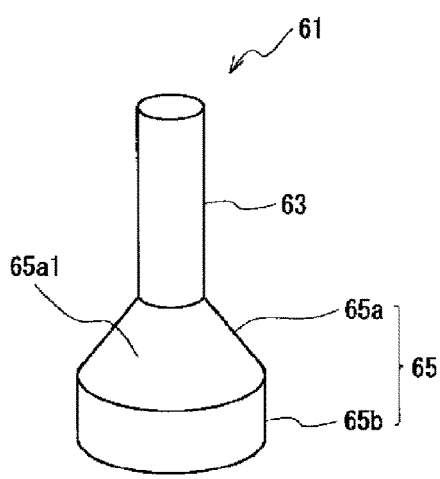
FIG. 3 is an external perspective view of a coupling member in the interface apparatus of FIG. 2.

Next, an interface apparatus according to the present embodiment, which constitutes the interface part 25, will be described with reference to FIG. 2 and FIG. 3. The interface part 25 includes a plurality of interface apparatuses 50. FIG. 2 is an explanatory view showing the schematic configuration of one interface apparatus 50. FIG. 3 is an external perspective view of a coupling member used for the interface apparatus 50.

The interface apparatus 50 of the present embodiment enables electrical connection between the test head 3 and an external connector (hereinafter, referred to as "external connector") 41 to be connected to each other. In the present embodiment, the external connector 41 is provided in the probe card 23.

The interface apparatus 50 includes a connector part 51 connected to the external connector 41 and a support part 53 that supports the connector part 51.

<Connector Part>

The connector part 51 includes a connector 51a, and a board 51c which is provided with a circuit wiring 51b connected to the external connector 41 via the connector 51a. That is to say, the connector part 51 is a printed circuit board (PCB) connector. In FIG. 2, only the contour of one connector is shown as the connector 51a, but the connector 51a is not limited thereto and may include a plurality of connectors. Alternatively, the connector 51a may include different kinds of connectors. The connector 51a has a plurality of terminals (not shown) to be fitted to the external connector 41. The circuit wiring 51b is connected to the test head 3 by a cable 71. In FIG. 2, the circuit wiring 51b and the cable 71 are schematically shown in a simplified manner.

(Positioning Part)

The connector part 51 includes a positioning part 81 for positioning the external connector 41 at a plurality of positions on the lower end of the connector part 51. The positioning part 81 includes a positioning pin 81a formed in, for example, a conical shape having a sharped end portion. By fitting the pin 81a into a positioning recess 83 formed in the vicinity of the external connector 41 of the probe card 23, it is possible to roughly perform positioning between the connector 51a of the connector part 51 and the external connector 41.

<Support Part>

The support part 53 includes a base member 55 and a holder 57 connected to the base member 55. Further, the support part 53 includes a spring 59 as a pushing member which is interposed between the base member 55 and the holder 57. Further, the support part 53 includes a coupling member 61 that connects the base member 55 and the holder 57. In FIG. 2, for the sake of convenience in description, the base member 55 and the holder 57 are shown in a longitudinal section (the same is also true in FIGS. 4 to 8).

(Base Member)

One end of the spring 59 and one end of the coupling member 61 are fixed to the base member 55 so that they are held by the base member 55.

(Holder)

The holder 57 is fixed to the connector part 51 by a fixing means (not shown) such as screws, and holds the connector part 51. The holder 57 has a constant thickness even in the Y direction (a direction orthogonal to the page in FIG. 2), and has a hollow section 57a formed therein. The hollow section 57a is formed in, for example, an inverted funnel, and has an upper reduced-diameter portion 57a1, a lower increased-diameter portion 57a2, and an opening-expanded portion 57a3 formed between the reduced-diameter portion 57a1 and the increased-diameter portion 57a2. The reduced-diameter portion 57a1 is a columnar opening opened toward an external space at the upper end of the holder 57. The increased-diameter portion 57a2 is a columnar opening having a larger diameter than that of the reduced-diameter portion 57a1. The opening-expanded portion 57a3 has an inner wall (a wall facing the hollow section 57a) of the holder 57 expanding downwards, and an inclined surface 57b formed therein. In FIG. 2, a direction in which the spring 59 pushes the holder 57 refers to a "downward" direction (indicated by the black arrows in FIG. 2 and hereinafter referred to as a "pushing direction"). The hollow section 57a may include a plurality of hollow sections 57a provided in X and Y directions of the holder 57 instead of a single hollow section. The coupling member 61 may be inserted into each of the plurality of hollow sections 57a.

(Spring)

The spring 59 is a coil spring, and is interposed between the base member 55 and the holder 57 to push the holder 57 toward the external connector 41. In this embodiment, a pair of springs 59 is provided at left and right sides in the X direction. However, the spring 59 may include three or more springs. Further, the springs 59 may be arranged in the Y direction. In addition to the spring 59, an elastic body having the same pushing force, such as a leaf spring or rubber, may be used as the pushing member.

(Coupling Member)

As shown in FIG. 3, the coupling member 61 includes a shaft portion 63 and an enlarged portion 65 formed at the lower end of the shaft portion 63. An upper end (base end portion) of the shaft portion 63 is fixed to the base member 55 by a fixing means (not shown) such as screws. The shaft portion 63 is inserted into the reduced-diameter portion 57a1 of the hollow section 57a. The enlarged portion 65 is accommodated in the increased-diameter portion 57a2 of the hollow section 57a. The enlarged portion 65 includes a conical portion 65a that is enlarged in the pushing direction from a portion leading to the shaft portion 63, and a cylindrical portion 65b leading to the conical portion 65a. The conical portion 65a has an inclined surface 65a1 formed at an angle corresponding to the inclined surface 57b of the holder 57.

In addition, clearances are applied between the shaft portion 63 of the coupling member 61 and the reduced-diameter portion 57a1 of the hollow section 57a, and between the enlarged portion 65 of the coupling member 61 and the increased-diameter portion 57a2 of the hollow section 57a, respectively.

FIG. 2 shows a state in which the holder 57 is separated from the base member 55 at a first interval L1 by virtue of the pushing force of the spring 59. The first interval L1 corresponds to the state in which a distance between the base member 55 and the holder 57 is the largest. In this state, the inclined surface 65a1 of the coupling member 61 is brought into contact with the inclined surface 57b of the holder 57, whereby the holder 57 is fixed to the base member 55.

Meanwhile, from the state of FIG. 2, when the base member 55 is pushed toward the holder 57 without a change in the vertical position of the connector part 51 at the lower end of the holder 57, the interval between the base member 55 and the holder 57 is reduced from the first interval L1 to a second interval L2 which is smaller than the first interval L1, against the pushing force of the spring 59. As will be described later, in the state in which the interval between the base member 55 and the holder 57 is close to the second interval L2, the inclined surface 65a1 of the coupling member 61 is separated from the inclined surface 57b of the holder 57 (see FIG. 5). Therefore, the coupling member 61 can move freely inside the hollow section 57a, and the fixing of the holder 57 by the coupling member 61 is released, whereby the holder 57 and the connector part 51 can move freely forwards, backwards, leftwards, and rightwards (i.e. in the X and Y directions), as shown in FIG. 2 with respect to the base member 55. That is to say, the holder 57 and the connector part 51 are freely movably coupled to the base member 55 via the coupling member 61.

<Connection Method>

Next, a connection method using the interface apparatus 50 of the present embodiment will be described with reference to FIG. 4 to FIG. 6. The connection method of the present embodiment may include the following steps 1 to 3.

(Step 1)

This step is a step of roughly aligning the connector part 51 and the external connector 41 in a state in which the holder 57 is separated from the base member 55 at the first interval L1 by virtue of the pushing force of the spring 59.

Figure 4:
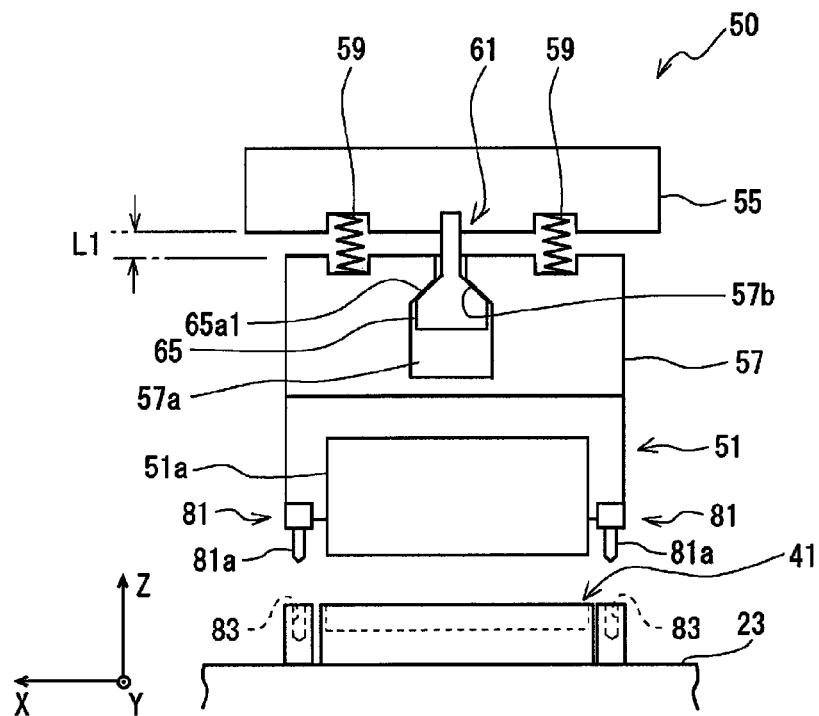
FIG. 4 is an explanatory view showing a state before connection in a connection method using the interface apparatus.

First, FIG. 4 shows a state before the connection. At this time, similarly to FIG. 2, the holder 57 is separated from the base member 55 at the first interval L1 by virtue of the pushing force of the spring 59. Accordingly, the inclined surface 65a1 of the coupling member 61 is in contact with the inclined surface 57b of the holder 57, whereby the holder 57 is fixed so as not to move relative to the base member 55. At this time, it is assumed that the coupling member 61 is in a fixed coupling position with respect to the holder 57.

In Step 1, in the state shown in FIG. 4, the connector part 51 and the external connector 41 are brought into contact with each other and are roughly positioned. At this time, the pin 81a of the positioning part 81 and the positioning recess 83 may be used.

(Step 2)

This step is a step of precisely aligning the connector part 51 and the external connector 41 using the free movement of the holder 57 when the interval between the base member 55 and the holder 57 is at the second interval L2 smaller than the first interval L1.

Figure 5:
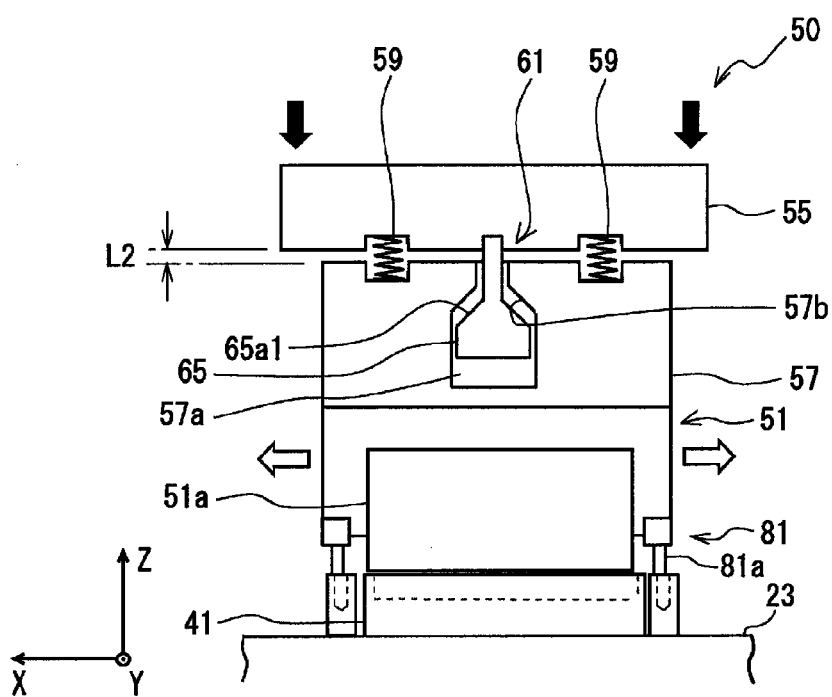
FIG. 5 is an explanatory view showing a state in which a connector is in contact with an external connector (FIG. 4 continued).

FIG. 5 shows a state in which the connector 51a is brought into contact with the external connector 41 in order to connect the connector 51a to the external connector 41. From the state of FIG. 4, a load is applied to the base member 55 and the connector part 51 is pressed onto the external connector 41, whereby the base member 55 and the holder 57 are brought close to each other against the pushing force of the spring 59. That is to say, in FIG. 5, for the connection, the connector 51a is brought into contact with the external connector 41 and is pressed from the side of the base member 55. Subsequently, by virtue of the pushing force applied from the side of the base member 55, the spring 59 contracts so that the interval between the base member 55 and the holder 57 is close to the second interval L2, which is smaller than the first interval L1.

In addition, in Step 2, it is only necessary to apply the pushing force between the connector 51a and the external connector 41. Therefore, instead of pushing the base member 55 side onto the external connector 41, the external connector 41 side may be pulled up toward the fixed base member 55.

In FIG. 5, the inclined surface 65a1 of the coupling member 61 is separated from the inclined surface 57b of the holder 57, whereby the fixing of the holder 57 by the coupling member 61 is released. At this time, the coupling member 61 can freely move forwards, backwards, rightwards, and leftwards (i.e. in the X and Y directions) inside the hollow section 57a. That is to say, the coupling member 61 is in a freely movable position with respect to the holder 57. As a result, the holder 57 and the connector part 51 can freely move forwards, backwards, rightwards, and leftwards (i.e. in the X and Y directions) with respect to the base member 55. White arrows indicated in FIG. 5 indicate the free movement in the X direction. In this manner, by using the clearance of the holder 57, the positions of the plurality of terminals (not shown) of the connector 51a can be finely adjusted in the X and Y directions, whereby the plurality of terminals is precisely aligned with the external connector 41.

(Step 3)

This step is a step of further applying a load to the base member 55 and fitting the connector 51a and the external connector 41 to each other.

From the state of FIG. 5, by further applying a pushing force to the base member 55, it is possible to fit the terminals of the connector 51a to the external connector 41. FIG. 6 shows a state in which the plurality of terminals (not shown) of the connector 51a is fitted to the external connector 41. In the state shown in FIG. 6, the spring 59 further contracts as compared with the state shown in FIG. 5, whereby the base member 55 and the holder 57 come into contact with each other so that there is no gap therebetween. Therefore, the load applied from the base member 55 side can be directly applied to the connector 51a. At this time, the coupling member 61 can freely move forwards, backwards, rightwards, and leftwards (i.e. in the X and Y directions) inside the hollow section 57a of the holder 57.

In addition, even in Step 3, instead of pushing the base member 55 side onto the external connector 41, the external connector 41 side may be pulled up towards the fixed base member 55.

By the above procedures, the plurality of terminals of the connector 51a can be precisely aligned to the external connector 41 and fitted into the external connector 41 for connection. Thus, the external connector 41 and the test head 3 can be electrically connected to each other.

<Disconnection Method>

Next, a disconnection method for detaching the connector 51a of the interface apparatus 50 from the external connector 41 will be described with reference to FIG. 7.

Figure 6:
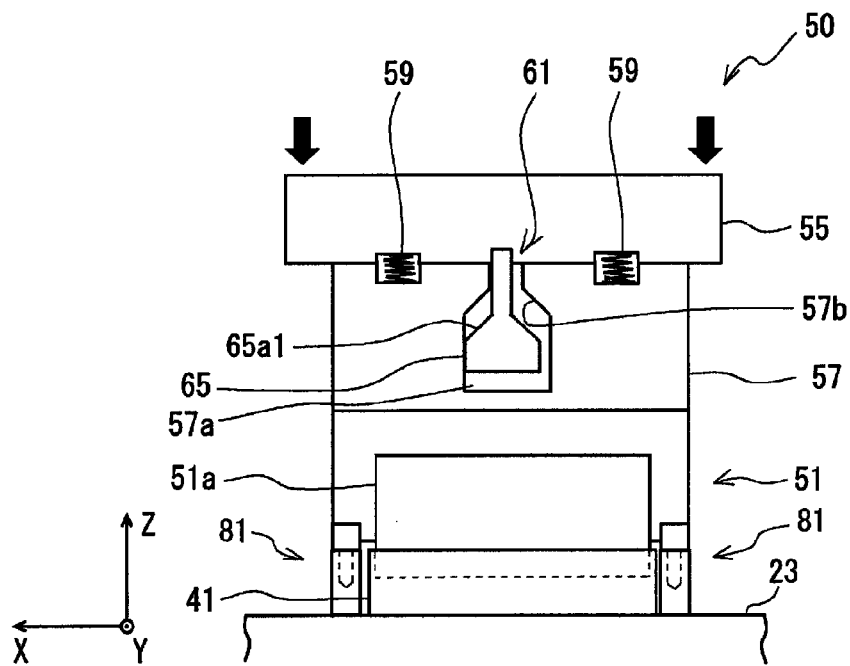
FIG. 6 is an explanatory view showing a state in which a terminal of the connector is fitted to an external connector (FIG. 5 continued).
Figure 7:
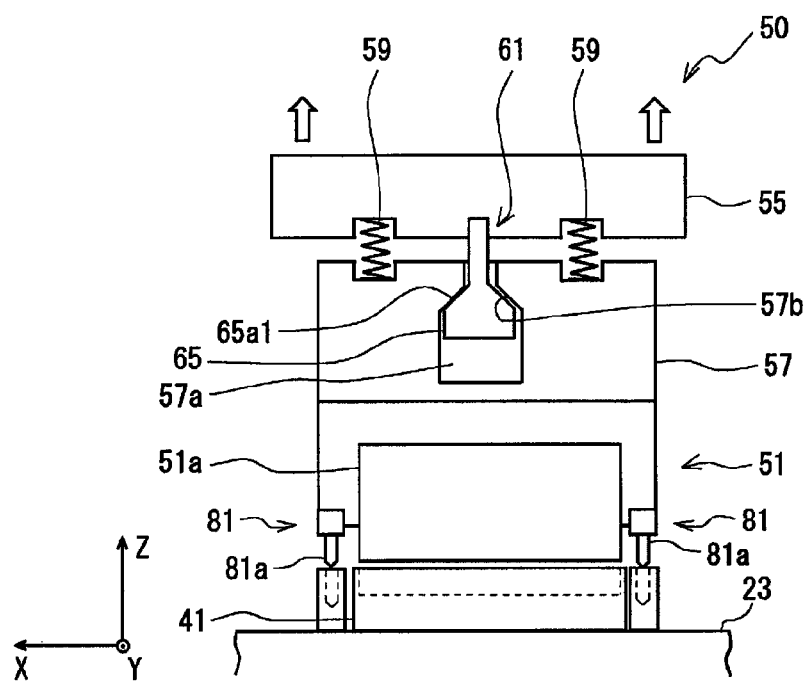
FIG. 7 is an explanatory view showing a disconnection method for detaching the connector of the interface apparatus from the external connector.

FIG. 7 shows a state in which a force (indicated by white arrows in FIG. 7) in a direction opposite the pushing force at the time of connection is applied to the base member 55 from the connection state of FIG. 6 to pull the base member 55 upward. At this time, the inclined surface 65a1 of the enlarged portion 65 of the coupling member 61 is engaged with the inclined surface 57b of the holder 57, whereby the holder 57 and the connector part 51 are also pulled up in conjunction with the base member 55.

The inclined surface 65a1 of the coupling member 61 is inclined at an angle corresponding to the inclined surface 57b of the holder 57. Thus, after the inclined surface 65a1 is brought into contact with the inclined surface 57b, the coupling member 61 moves relative to the holder 57 while sliding, and consequently reaches the position (fixed coupling position) shown in FIG. 4. As a result, the holder 57 is fixed so as not to move relative to the base member 55. The interval between the base member 55 and the holder 57 finally recovers from the contact state of FIG. 6 to the first interval L1. Likewise, the spring 59 also extends more than the state shown in FIG. 7 and returns to the state shown in FIG. 4.

In the above manner, it is possible to release the connection by detaching the connector 51a of the interface apparatus 50 from the external connector 41. In addition, in order to release the connection, instead of pulling the base member 55 upwards, the external connector 41 side may be pulled downwards.

<Interface Unit>

Figure 8:
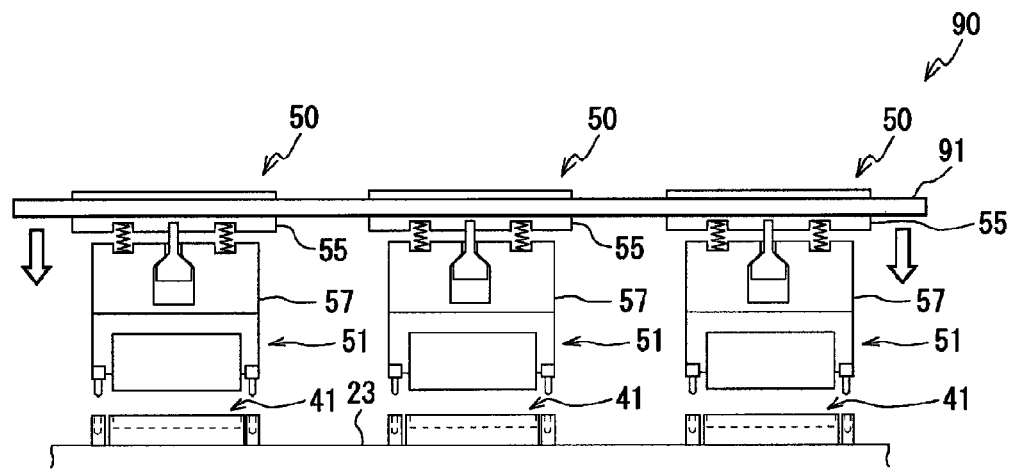
FIG. 8 is an explanatory view showing an example of an interface unit.

In the present embodiment, the plurality of interface apparatuses 50 can be collectively connected to the plurality of external connectors 41. In this case, as shown in FIG. 8, an interface unit 90 may be configured using a support member that collectively supports the plurality of interface apparatuses 50 in a connectable manner. That is to say, the interface unit 90 of the present embodiment includes the plurality of interface apparatuses 50 and a support plate 91 as a support member for collectively supporting the plurality of interface apparatuses 50.

In the interface unit 90, the support plate 91 has, for example, an opening (not shown) to be fitted to the base member 55 of each interface apparatus 50. The base member 55 is fitted to the opening so that the plurality of interface apparatuses 50 can be collectively held. In addition, each interface apparatus 50 may be fixed to the support plate 91 by an arbitrary fixing means such as screws. By using the interface unit 90, it is possible to collectively connect the connectors 51a of the plurality of interface apparatuses 50 to the plurality of external connectors 41. Even in this case, the holder 57 and the connector part 51 of each interface apparatus 50 can be freely moved in the X and Y directions by pulling the support plate 91 down toward the external connector 41 or pulling the external connector 41 upwards. This provides precise alignment (see FIG. 5).

As described above, according to the interface apparatus 50 of the present embodiment, the alignment of the connector 51a can be performed with high accuracy, and the connector 51a can be reliably connected to the external connector 41. Therefore, by using the interface apparatus 50 of the present embodiment, the probe inspection can be performed in the probe device 100 with a high degree of reliability.

<Control Part>

Figure 9:
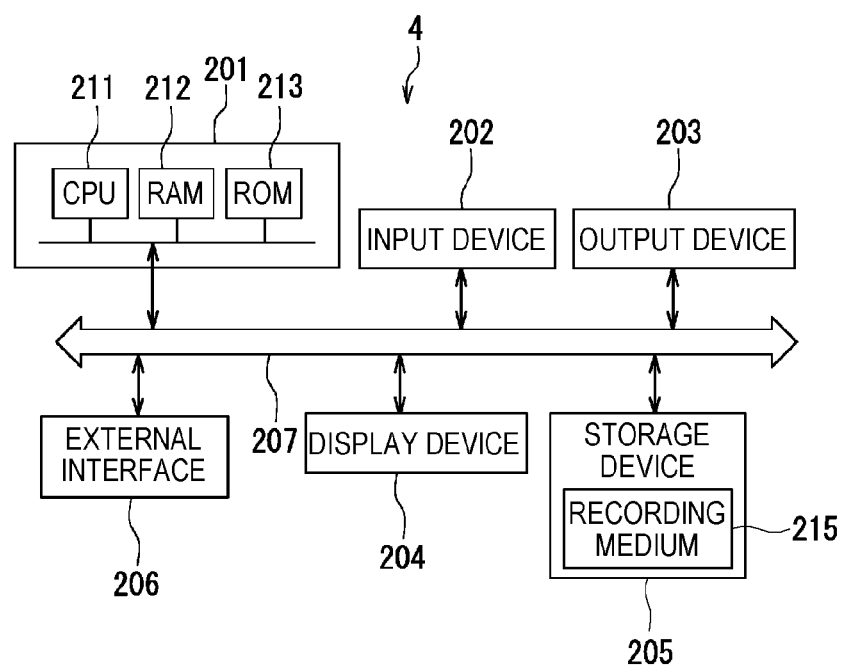
FIG. 9 is a block diagram showing the hardware configuration of a control part.

The control part 4 controls the operations of respective components of the probe device 100. The control part 4 is typically a computer. FIG. 9 shows an example of a hardware configuration of the control part 4. The control part 4 includes a main control part 201, an input device 202 such as a keyboard or a mouse, an output device 203 such as a printer, a display device 204, a storage device 205, an external interface 206, and a bus 207 connecting these components to each other. The main control part 201 has a central processing unit (CPU) 211, a random access memory (RAM) 212, and a read-only memory (ROM) 213. The storage device 205 need not be formed of any certain type as long as the storage device 205 can store information. For example, the storage device 205 may include a hard disc device or an optical disc device. Further, the storage device 205 records information on a computer-readable recording medium 215 and reads information from the recording medium 215. The recording medium 215 need not be formed of any certain type as long as the recording medium 215 can store information. For example, the recording medium 215 may include a hard disc, an optical disc, a flash memory, or the like. The recording medium 215 may be a recording medium that records a recipe of the probe inspection method performed in the probe device 100 of the present embodiment.

The control part 4 controls the probe device 100 according to the present embodiment to perform the device inspection on a plurality of wafers W. Specifically, the control part 4 controls the respective components (for example, the test head 3, the stage 11 or the like) in the probe device 100. The CPU 211 uses the RAM 212 as a work area and executes software (program) stored in the ROM 213 or the storage device 205 to realize the aforementioned control.

[Probe Inspection Procedure]

In the probe device 100 configured as above, the probe card holder 21 holding the probe card 23 is delivered from an external transfer device to the internal transfer mechanism 29, and the internal transfer mechanism 29 transfers the probe card holder 21. The internal transfer mechanism 29 attaches the probe card holder 21 to the insertion ring 15. At this time, as described above, in the interface part 25, the connectors 51a of the plurality of interface apparatuses 50 are collectively connected to a plurality of connection parts (the external connectors 41) of the probe card 23 so that the test head 3 and each probe 23a of the probe card 23 are electrically connected to each other.

Subsequently, the stage 7 moves in the horizontal direction (the X direction, the Y direction, and the θ direction) and the vertical direction (the Z direction) so that the relative position between the probe card 23 and the wafer W held on the stage 11 is adjusted. The electrode of the device and the probe 23a are brought into contact with each other. The test head 3 supplies an inspection current to the device through the interposer (or performance board) 27, the interface part 25, and each probe 23a of the probe card 23. The probe card 23 transmits an electrical signal indicating the electrical characteristics of the device to the test head 3 via the interface part 25 and the interposer (or performance board) 27. The test head 3 stores the transmitted electrical signal as measurement data and determines the presence or absence of an electrical defect of the device to be inspected.

As described above, the interface apparatus 50 according to the present embodiment can precisely perform the alignment process using the free movement of the holder 57 and the connector part 51. As a result, even in the connection using the fitting structure, the connector part 51 can be reliably connected to the external connector 41. The interface apparatus 50 is advantageous when the plurality of connectors 51a is collectively connected to the plurality of external connectors 41. Further, it is also possible to collectively connect the plurality of interface apparatuses 50 to the plurality of external connectors 41. Further, the interface apparatus 50 can flexibly cope with the case in which there is a limit in the alignment accuracy or processing accuracy between the connector part 51 and the external connector 41 or the case in which there is instrument error in the probe card 23. Therefore, by using the interface apparatus 50 of the present embodiment, the probe inspection can be performed in the probe device 100 with a high degree of reliability.

Although the embodiments of the present disclosure have been described above in detail for the purpose of illustration, the present disclosure is not limited to the above embodiments, and various modifications are possible. For example, the substrate is not limited to the semiconductor wafer, but may be a substrate for a flat-panel display typified by a glass substrate used for a liquid crystal display device, a resin substrate on which a large number of semiconductor integrated circuit (IC) chips are mounted, or a substrate for mounting inspection such as a glass substrate.

In addition, in the above embodiment, the interface apparatus 50 is provided in the interface unit 25, but may be provided in another member such as the interposer (or performance board) 27, or the like.

In addition, in the above embodiment, the holder 57 is configured to hold the connector part 51 including the plurality of connectors 51a. However, the plurality of connectors 51a may be fixed directly to the holder 57 and may be held by the holder 57.

In addition, the configuration of the connector 51a and the external connector 41 is not particularly limited. For example, the connector 51a may have a male-type terminal and the external connector 41 may have a female-type terminal. Alternatively, the connector 51a may have a female-type terminal and the external connector 41 may have a male-type terminal.

In addition, while in the above embodiment, the case in which the terminal of the connector 51a is fitted to the external connector 41 has been described, the present disclosure is not limited to such a fitting structure and may be widely applied when two connectors are aligned and connected to each other. The present disclosure can also be applied to, for example, a structure in which a terminal, an electrode pad, and the like are brought into contact with each other for connection.

This international application claims priority based on Japanese Patent Application No. 2015-187290 filed on Sep. 24, 2015, the entire contents of which are hereby incorporated by reference.

What is claimed is:

1. An interface apparatus comprising:
   a connector configured to be connected to an external connector; and
   a support part configured to support the connector,
   wherein the support part includes:
   a base member;
   a holder configured to be connected to the base member, having a hollow section defined therein, and configured to hold the connector;
   a pushing member interposed between the base member and the holder, and configured to push the holder toward the external connector; and
   a coupling member configured to be fixed to the base member and configured to be inserted into the hollow section of the holder with a clearance applied between the coupling member and the hollow section,
   wherein the coupling member is engaged with an inner wall of the hollow section in a state in which the holder is separated from the base member at a first interval by virtue of a pushing force of the pushing member, whereby the holder is fixed to the base member, and
   the coupling member is separated from the inner wall of the hollow section when the base member and the holder are separated from each other at a second interval smaller than the first interval, against the pushing force, whereby the holder is freely movable relative to the base member.

2. The interface apparatus of claim 1, wherein the connector is fitted to the external connector.

3. The interface apparatus of claim 1, wherein the inner wall has an inclined surface that is expanded in a direction in which the pushing member pushes the holder, and the coupling member has a conical-shaped portion having an inclined surface corresponding to the inclined surface.

4. The interface apparatus of claim 1, wherein an interval between the base member and the holder is reduced from the first interval to the second interval by virtue of the pushing force by which the connector and the external connector push against each other.

5. The interface apparatus of claim 1, wherein the connector includes a circuit board provided with a wiring connected to the external connector.

6. The interface apparatus of claim 1, further comprising: a positioning part configured to perform a positioning operation between the connector and the external connector.

7. An interface unit comprising:
the interface apparatus of claim 1; and
a support member configured to collectively support a plurality of interface apparatuses,
wherein the plurality of interface apparatuses is collectively connected to a plurality of external connectors.

8. A probe device comprising the interface apparatus of claim 1.

9. A connection method for connecting an interface apparatus to an external connector,
wherein the interface apparatus includes:
a connector configured to be connected to the external connector; and
a support part configured to support the connector,
wherein the support part includes:
a base member;
a holder configured to be connected to the base member, having a hollow section defined therein, and configured to hold the connector;
a pushing member interposed between the base member and the holder and configured to push the holder toward the external connector; and
a coupling member configured to be fixed to the base member and configured to be inserted into the hollow section of the holder with a clearance applied between the coupling member and the hollow section,
wherein the coupling member is engaged with an inner wall of the hollow section in a state in which the holder is separated from the base member at a first interval by virtue of a pushing force of the pushing member, whereby the holder is fixed to the base member, and
the coupling member is separated from the inner wall of the hollow section in a state in which the base member and the holder close to each other at a second interval smaller than the first interval, against the pushing force, whereby the holder is freely movable relative to the base member;
the connection method comprising:
roughly aligning the connector and the external connector in a state in which the holder is separated from the base member at the first interval by virtue of the pushing force of the pushing member;
precisely aligning the connector and the external connector using the free movement of the holder when the base member and the holder are separated from each other at the second interval smaller than the first interval against the pushing force by pushing the connector and the external connector against each other; and
fitting the connector to the external connector by pushing the connector and the external connector against each other.

* * * * *